United States Patent [19]

Tsuji et al.

[11] Patent Number: 5,449,110

[45] Date of Patent: Sep. 12, 1995

[54] METHOD OF SOLDERING LEAD TERMINAL TO SUBSTRATE

[75] Inventors: Hirokazu Tsuji; Shigeo Yamashita; Yasuaki Ohno, all of Nagaokakyo, Japan

[73] Assignee: Murata Mfg. Co., Ltd., Japan

[21] Appl. No.: 252,697

[22] Filed: Jun. 2, 1994

[30] Foreign Application Priority Data

Jun. 4, 1993 [JP] Japan .................. 5-134392

[51] Int. Cl.6 ..................... H05K 3/34; H01R 9/16
[52] U.S. Cl. .................. 228/180.21; 228/135; 228/258
[58] Field of Search ........... 228/135, 180.21, 258–260, 228/36, 37

[56] References Cited

U.S. PATENT DOCUMENTS 5,297,484  3/1994  Piserchia et al. .................. 105/1.5

Primary Examiner—Samuel M. Heinrich
Attorney, Agent, or Firm—Ostrolenk, Faber, Gerb & Soffen

[57] ABSTRACT

A method of preparing a substrate (1) having terminal electrodes (2, 3) which are provided on its both surfaces and a through hole (4), having a conductive film (5) formed on its inner peripheral surface, provided between the terminal electrodes (2, 3), mounting a lead terminal (9) having a pair of branch portions (9a, 9b) for elastically holding said terminal electrodes (2, 3) therebetween to the substrate (1), dipping the substrate (1) in molten solder from its lower surface (1b), drawing out the substrate (1) and solidifying the molten solder, thereby soldering the lead terminal (9) to the terminal electrodes (2, 3).

6 Claims, 3 Drawing Sheets

METHOD OF SOLDERING LEAD TERMINAL TO SUBSTRATE

BACKGROUND OF THE INVENTION

1. Field of the Invention

The present invention relates to a method of soldering a lead terminal to a substrate, and more particularly, it relates to a method of soldering a lead terminal, to be mounted on a substrate for holding terminal electrodes which are formed on both surfaces of the substrate, to the substrate.

2. Description of the Background Art

Generally known is a method of forming a single electronic component by preparing a substrate having at least one electronic component which is mounted on its substrate surface and soldering a lead terminal to the substrate. An exemplary method of manufacturing such an electronic component provided with a lead terminal is now described with reference to FIGS. 4 and 5.

First, a substrate 23 which are provided with terminal electrodes 21 and 22 in the vicinity of its first end surface 23a is prepared, The terminal electrode 21 is formed on a lower surface 23b of the substrate 23, while the terminal electrode 22 is formed on an upper surface 23c of the substrate 23 to be opposed to the terminal electrode 21 through the substrate 23.

Further, a plurality of chip-type electronic components 24a and 24b are temporarily fixed onto the lower surface 23b of the substrate 23. These chip-type electronic components 24a and 24b are temporarily fixed onto the lower surface 23b of the substrate 23 through an adhesive for temporary fixation.

On the other hand, a lead electronic component 25 is temporarily fixed onto the upper surface 23c of the substrate 23. The lead electronic component 25 has a plurality of lead terminals 26a and 26b, which are inserted in through holes (not shown) provided in the substrate 23.

Then, the substrate 23 is dipped in molten solder from the lower surface 23b, and thereafter drawn out from the same so that the molten solder adhering to the substrate 23 is solidified to solder the chip-type electronic components 24a and 24b to electrode lands (not shown) which are formed on the lower surface 23b of the substrate 23. Thus, the chip-type electronic components 24a and 24b are electrically connected to the electrode lands by solder 28, as shown in FIG. 5. The lead terminals 26a and 26b of the lead electronic component 25 are also electrically connected to electrode lands (not shown) which are formed on the lower surface 23b of the substrate 23 by solder 28.

Then, a lead terminal 27 having a pair of branch portions 27a and 27b is mounted on the end surface 23a of the substrate 23. The lead terminal 27 is provided with the branch portions 27a and 27b, which are formed on a forward end of an elongated body portion 27c in a bent-up manner to have spring properties themselves. Inner surfaces of the branch portions 27a and 27b are brought into contact with the terminal electrodes 21 and 22, for holding the substrate 23 therebetween. At this time, the lead terminal 27 is temporarily fixed to the substrate 23 due to the spring properties of the branch portions 27a and 27b.

Then, the substrate 23 shown in FIG. 5 is so turned as to downwardly direct the end surface 23a, dipped in molten solder and thereafter drawn out from the same, so that the molten solder adhering to the substrate 23 is solidified to solder the branch portions 27a and 27b to the terminal electrodes 21 and 22.

While the lead terminal 27 is soldered to the first end surface 23a of the substrate 25 in FIGS. 4 and 5, another lead terminal is also soldered to a second end surface, which is opposite to the end surface 23a of the substrate 23a. Thus, it is possible to obtain a composite electronic component having a pair of lead terminals, by bonding such a pair of lead terminals 27 to the substrate 23 provided with a plurality of electronic components 24a, 24b and 25.

In order to manufacture the aforementioned electronic component which is bonded with the lead terminal 27, (1) a step of soldering the electronic components 24a, 24b and 25 to the electrode lands provided on the substrate 23 and (2) a step of soldering the lead terminal 27 to the substrate 23 must be carried out independently of each other. Thus, a plurality of soldering steps must be carried out through complicated operations.

When the electronic components 24a and 24b are soldered onto the substrate 23, further, the molten solder may also adhere to the terminal electrode 21, to remain thereon in a solidified state. Consequently, the terminal electrode 21 may be increased in thickness by the solder adhering thereto such that it is difficult to hold the substrate 23 between the branch portions 27a and 27b. If the substrate 23 is forcibly inserted between the branch portions 27a and 27b, the spring properties of the branch portions 27a and 27b are deteriorated to reduce holding power for the substrate 23. In this case, therefore, it is necessary to remove the solder adhering onto the terminal electrode 21.

SUMMARY OF THE INVENTION

Accordingly, an object of the present invention is to provide a method of soldering a lead terminal to a substrate having terminal electrodes on both surfaces thereof for holding the terminal electrodes, which can simplify a soldering step with no necessity for an operation for removing unwanted solder.

According to a wide aspect of the present invention, provided is a method of soldering a lead terminal to a substrate comprising a step of preparing a substrate having first and second terminal electrodes which are provided on first and second ends thereof, and a through hole, having a conductive film provided on its inner peripheral surface, which is adapted to connect the first and second terminal electrodes with each other, a step of mounting a lead terminal having first and second branch portions to the substrate for holding the substrate between the first and second branch portions so that the first and second branch portions are in contact with the first and second terminal electrodes provided on the substrate, a step of supplying molten solder to the first terminal electrode of the substrate while supplying the molten solder also to the second terminal electrode through the through hole, and a step of drawing out the substrate and the lead terminal from the molten solder for solidifying the molten solder adhering thereto.

According to the present invention, the through hole is formed in the substrate to connect the first and second terminal electrodes with each other, while the conductive film is formed on the inner peripheral surface of the through hole. When the molten solder is supplied to the first terminal electrode for soldering the lead terminal, therefore, the molten solder as supplied reaches the second terminal electrode through the conductive film which is provided on the inner peripheral surface of the through hole, to be also supplied onto a surface of the second terminal electrode. Thus, it is possible to solder the first and second branch portions of the lead terminal to the first and second terminal electrodes by simply soldering the surface of the substrate provided with the first terminal electrode in the molten solder while temporarily fixing the lead terminal to the substrate and drawing out the same. Consequently, it is possible to solder the pair of branch portions of the lead terminal to the first and second terminal electrodes which are provided on both surfaces of the substrate in a single soldering step.

According to a specific aspect of the present invention, at least one electronic component is temporarily fixed to at least one surface of the substrate as prepared. Thus, it is possible to solder the electronic component which is temporarily fixed to the surface of the substrate provided with the first terminal electrode in the same step as that for soldering the lead terminal. In other words, it is possible to solder the temporarily fixed electronic component and the lead terminal having the pair of branch portions in a single soldering step.

Preferably, at least one chip-type electronic component is temporarily fixed to the substrate surface provided with the first terminal electrode, so that the at least one chip-type electronic component is soldered to the substrate in the same step as that for soldering the lead terminal.

Preferably, a lead electronic component is temporarily fixed to the substrate surface provided with the first terminal electrode and a lead wire of the lead electronic component is exposed on the substrate surface provided with the first terminal electrode, to be soldered to the substrate on this substrate surface. Also in this case, it is possible to solder the lead electronic component to the substrate in the same step as that for soldering the lead terminal.

According to the inventive method of soldering a lead terminal to a substrate, therefore, it is possible to simplify the step of soldering the lead terminal to the substrate, while it is not necessary to carry out a step of removing unwanted solder, which has been required in the prior art.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

A preferred embodiment of the present invention is now described with reference to the drawings.

Figure 1:
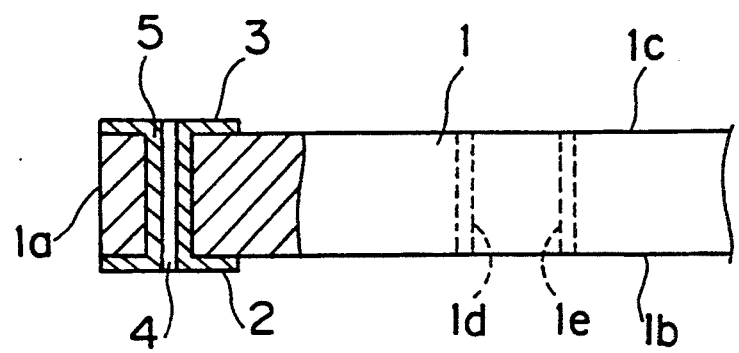
FIG. 1 is a partially fragmented local sectional view for illustrating a substrate which is prepared in an embodiment of the present invention.

First, a substrate 1 shown in FIG. 1 is prepared. The substrate 1 has a first terminal electrode 2 which is formed on its lower surface 1b and a second terminal electrode 3 which is formed on its upper surface 1c in the vicinity of its first end surface 1a. The first and second terminal electrodes 2 and 3 are formed to be opposed to each other through the substrate 1. The substrate 1 is further provided with a through hole 4 for connecting the first and second terminal electrodes 2 and 3 with each other. A conductive film 5 is formed on an inner peripheral surface of the through hole 4. Thus, the first and second terminal electrodes 2 and 3 are connected with each other by the conductive film 5.

The substrate 1 can be properly made of insulating ceramics such as alumina or synthetic resin such as polyimide. On the other hand, the terminal electrodes 2 and 3 and the conductive film 4 can be prepared by applying conductive paste onto the substrate 1 and hardening the same, by applying conductive paste thereto and baking the same, or by a proper conductive film applying method such as vacuum evaporation.

The substrate 1 is further provided on its lower surface 1b with a plurality of electrode lands (not shown) to be electrically connected with electronic components as described later.

Further, a plurality of through holes 1d and 1e are formed in the substrate 1.

Figure 2:
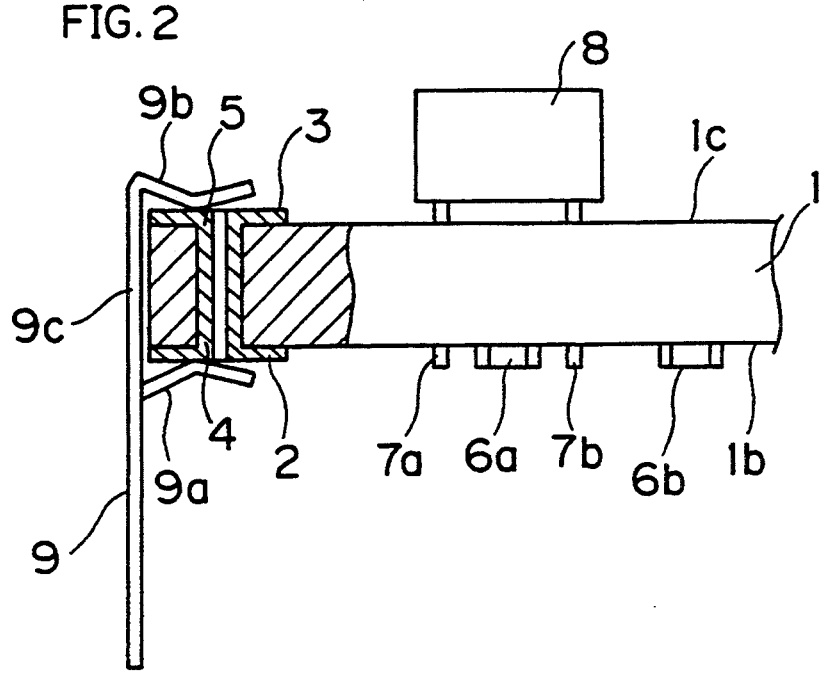
FIG. 2 is a partially fragmented local sectional view showing electronic components and a lead terminal which are temporarily fixed to the substrate shown in FIG. 1.

Then, a plurality of chip-type electronic components 6a and 6b are temporarily fixed onto the lower surface 1b of the substrate 1, as shown in FIG. 2. The chip-type electronic components 6a and 6b, which can be formed by proper chip-type electronic components such as chip-type multilayer capacitors, are temporarily fixed onto the lower surface 1b by an adhesive or the like.

On the other hand, a lead electronic component 8 is temporarily fixed onto the upper surface 1c of the substrate 1. This lead electronic component 8 has leads 7a and 7b, which are inserted in the through holes 1d and 1e (see FIG. 1) respectively to temporarily fix the lead electronic component 8 to the substrate 1.

Then, a lead terminal 9 is mounted on the substrate 1 in the same step as that for temporarily fixing the electronic components 6a, 6b and 8 to the substrate 1. The lead terminal 9 has an elongated body portion 9c, and first and second branch portions 9a and 9b which are formed on a forward end of the body portion 9c in a bent-up manner. The first and second branch portions 9a and 9b are bent at central portions thereof, to have spring properties respectively. The distance between the pair of branch portions 9a and 9b is so selected as to hold the first and second terminal electrodes 2 and 3 therebetween. Namely, the substrate 1 is elastically held by the first and second branch portions 9a and 9b in portions provided with the first and second terminal electrodes 2 and 3.

Then, the substrate 1 is dipped in molten solder from the lower surface 1b in the state shown in FIG. 2. Thereafter the substrate 1 is drawn out from the molten solder, so that the molten solder adhering thereto is solidified for soldering. At this time, the electronic components 6a and 6b are soldered to the electrode lands which are formed on the lower surface 1b of the substrate 1, while the leads 7a and 7b are also soldered to the electrode lands formed on the lower surface 1b. Further, the branch portion 9a of the lead terminal 9 is soldered to the first terminal electrode 2 by the molten solder adhering thereto. In addition, the molten solder as supplied is guided to the second terminal electrode 3 from the first terminal electrode 2 through the through hole 4, to also adhere to the terminal electrode 3 and the second branch portion 9b. Consequently, the pair of branch portions 9a and 9b are also soldered to the terminal electrodes 2 and 3 by the aforementioned dipping in the molten solder and solidification of the molten solder, as shown in FIG. 3.

According to this embodiment, the molten solder is also supplied to the upper surface 1c of the substrate 1 from the lower surface 1b through the through hole 4, whereby not only soldering of the electronic components 6a, 6b and 8 but soldering between the lead terminal 9 and the terminal electrodes 2 and 3 can be completed in the same step.

Figure 3:
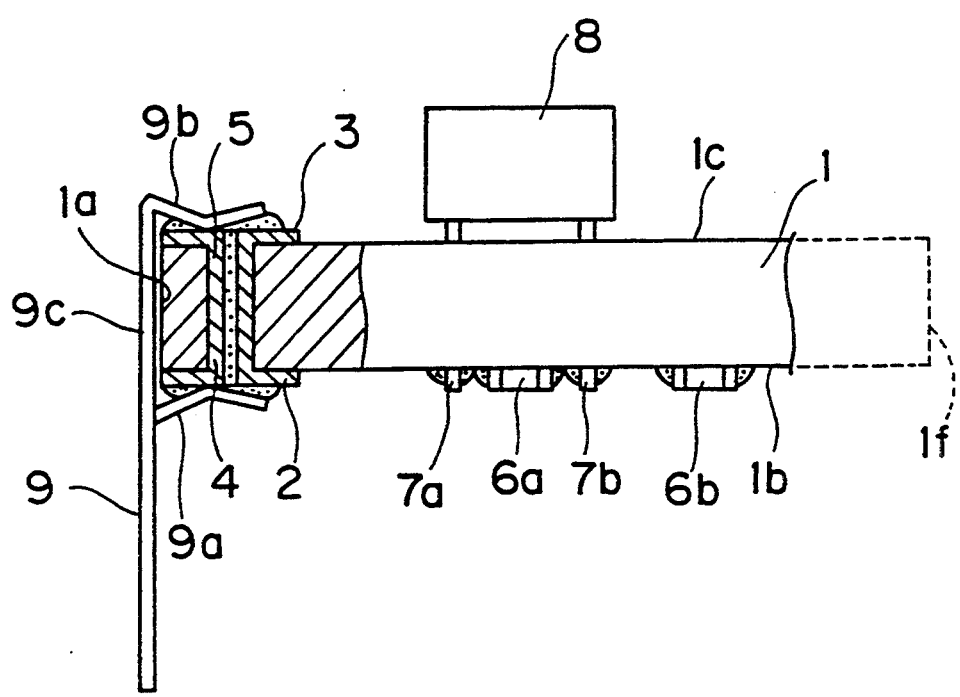
FIG. 3 is a partially fragmented local sectional view showing the electronic components and the lead terminal appearing in FIG. 2, which are soldered to electrodes provided on the substrate.
Figure 4:
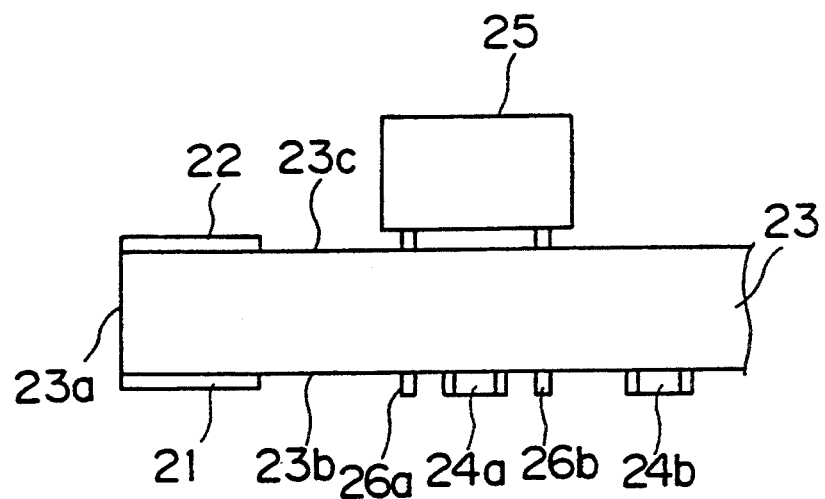
FIG. 4 is a partially fragmented local sectional view showing electronic components which are temporarily fixed to a substrate in a conventional method of manufacturing an electronic component.
Figure 5:
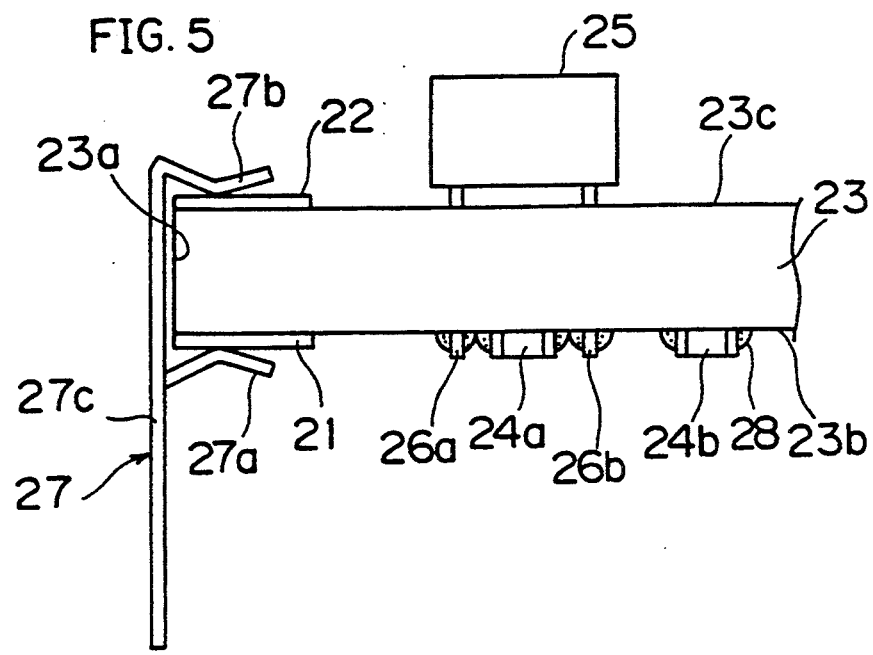
FIG. 5 is a side elevational view showing the electronic components which are soldered to the substrate and a lead terminal which is mounted on the substrate in the conventional method.

While the lead terminal 9 is soldered to the first end surface 1a of the substrate 1 in the aforementioned embodiment, additional terminal electrodes may be formed on the major surfaces of the substrate 1 also on its second end surface 1f, shown by broken lines in FIG. 3, which is opposite to the first end surface 1a, so that another lead terminal having a pair of branch portions are also soldered thereto. Thus, it is possible to obtain a composite electronic component having a pair of lead terminals according to the inventive method.

While the electronic components 6a and 6b and the leads 7a and 7b of the electronic component 8 are soldered to the substrate surface provided with the first terminal electrode 2, i.e., the lower surface 1b, the present invention is also applicable to such a structure that additional electronic components are soldered onto the opposite surface of the substrate 1, i.e., the upper surface 1c.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of soldering a lead terminal to a substrate, comprising:

a step of preparing a substrate having first and second terminal electrodes being provided on first and second surfaces thereof respectively and a through hole being formed to connect said first and second terminal electrodes with each other, said through hole being provided with a conductive film on its inner peripheral surface;

a step of mounting a lead terminal having first and second branch portions to said substrate for holding said substrate between said first and second branch portions while bringing said first and second branch portions into contact with said first and second terminal electrodes being provided on said substrate;

a step of supplying molten solder to said first terminal electrode of said substrate while supplying said molten solder also to said second terminal electrode through said through hole; and a step of drawing out said substrate from said molten solder and solidifying said molten solder adhering thereto.

2. A method of soldering a lead terminal to a substrate in accordance with claim 1, wherein said substrate as prepared further comprises at least one electronic component being temporarily fixed to at least one surface of said substrate.

3. A method of soldering a lead terminal to a substrate in accordance with claim 2, wherein said substrate as prepared further comprises at least one chip-type electronic component being temporarily fixed to a substrate surface being provided with said first terminal electrode.

4. A method of soldering a lead terminal to a substrate in accordance with claim 2, wherein said substrate as prepared further has a plurality of holes, at least one lead electronic component being further provided to be so temporarily fixed that its leads are inserted in said holes from a substrate surface provided with said second terminal electrode.

5. A method of soldering a lead terminal to a substrate in accordance with claim 1, wherein said first and second terminal electrodes and said conductive film are made of the same conductive material, and integrally formed with each other.

6. A method of soldering a lead terminal to a substrate in accordance with claim 1, wherein said first and second terminal electrodes and said lead terminal are formed on each of opposite end portions of said substrate.

* * * * *